United States Patent [19]

Kiesel

[11] 4,218,627

[45] Aug. 19, 1980

[54] ELECTRICAL MEAN SQUARE VOLTAGE SENSOR

[75] Inventor: Kenneth C. Kiesel, Wayland, Mass.

[73] Assignee: Polaroid Corporation, Cambridge, Mass.

[21] Appl. No.: 938,768

[22] Filed: Sep. 1, 1978

[51] Int. Cl.² ............................................. H03K 3/42
[52] U.S. Cl. ................................... 307/311; 307/308; 307/318; 250/552; 323/21
[58] Field of Search .................. 307/311, 318; 357/28; 250/552; 323/21

[56] References Cited

U.S. PATENT DOCUMENTS

| 3,060,330 | 10/1962 | Trampel | 307/318 |
| 4,063,121 | 12/1977 | Bartlett | 307/311 |
| 4,079,272 | 3/1978 | Howatt | 307/311 |

OTHER PUBLICATIONS

IBM Tech. Disclre. Bttn., A.C. Voltage Present Sensor, K. A. Braithwaite, vol. 20, No. 3, 8/77, p. 1135.

Primary Examiner—Stanley D. Miller, Jr.
Assistant Examiner—B. P. Davis
Attorney, Agent, or Firm—Edward S. Roman

[57] ABSTRACT

A sensor for producing an electrical signal parameter responsive to the mean square of an applied alternating voltage has a rectifier element, and has a zener diode element electrically in series with a light-emitting diode element across the direct voltage which the rectifier element produces. The polarity of the direct voltage applies reverse voltage to the zener diode element and applies forward voltage to the light-emitting diode element. A photoconductor is optically coupled to receive electroluminescense which the light-emitting diode element emits.

12 Claims, 6 Drawing Figures

ELECTRICAL MEAN SQUARE VOLTAGE SENSOR

BACKGROUND OF THE INVENTION

This invention relates to an electrical sensor for producing a signal in which the value of one parameter is responsive to the mean square of an applied voltage. More particularly, the invention provides a sensor that changes the resistance of a bilateral circuit component according to the mean square value of an applied voltage.

Sensors of this type are employed in a variety of electrical devices, typically to provide a feedback or other controlling signal that changes in proportion to the mean square of an alternating voltage that is being controlled. The resultant control can provide regulation of the mean square or of the root mean square (RMS) of the voltage.

Objects of the invention include providing a mean square sensor that requires few components. Further objects are to provide such a sensor that is physically compact, and that is relatively low in cost but yet reliable in operation under even relatively adverse environmental conditions.

Another object of the invention is to provide a mean square sensor which operates with relatively little power consumption, i.e., which is electrically efficient.

Other objects of the invention will in part be obvious and will in part appear hereinafter.

SUMMARY OF THE INVENTION

An electrical sensor embodying the invention has two semiconductor junction elements in series, and one of which is coupled to a resistive output element. One semiconductor junction element is reverse biased in the circuit and operates on the zener characteristic of the junction. The other junction is electroluminescent and is forward biased. The resistive output element is a photoconductor optically coupled to receive luminescence which the latter junction emits. It has been found that this combination of the three circuit elements produces a photoconductor resistance which varies inversely with the mean square of a varying direct voltage. The sensor generally is used to sense an alternating voltage, in which case it includes a recitifier element, and the photoconductor conductance then changes according to the mean square of the applied alternating voltage.

The practice of the invention with currently available components employs a zener diode and an optoisolator having a light-emitting diode (LED) input element optically coupled with a photoconductor output element. The following description refers to the semiconductor elements in these terms, for clarity of description.

The resistance of the photoconductor has a short rise time but a significantly longer decay time. As a result, the photoconductor resistance drops rapidly as the current in the light-emitting diode rises, but rises slowly when the diode current drops or terminates. This enables the sensor of the invention to receive an applied voltage for a brief time and to maintain an output responsive to that applied voltage, as for processing, after the applied voltage terminates. This characteristic enables the sensor to be useful in thyristor phase control and like applications.

The combination of the zener diode with the light-emitting diode and photoconductor results in a photoconductor conductance that follows, to at least a substantial approximation, the mean square of an applied varying direct voltage, and similarly the mean square of an applied alternating voltage which is rectified before application to the two-diode combination.

The sensor circuit which the invention provides thus employs relatively few components, typically requiring only a rectifier, a zener diode, and an LED-photoconductor isolator. A protective series current limiter is also provided. The components are readily packaged compactly and operate reliably over a variety of ambient conditions covering such factors as vibration, shock, temperature, and orientation. Further, the circuit elements dissipate essentially negligible electrical power, and hence the sensor operates with relatively high electrical efficiency.

The invention accordingly comprises the features of construction, combination of elements, and arrangement of parts exemplified in the constructions hereinafter set forth, and the scope of the invention is indicated in the claims.

BRIEF DESCRIPTION OF DRAWINGS

For a fuller understanding of the nature and objects of the invention, reference should be made to the following detailed description and the accompanying drawings, in which.

DESCRIPTION OF THE ILLUSTRATED EMBODIMENTS

Figure 1:
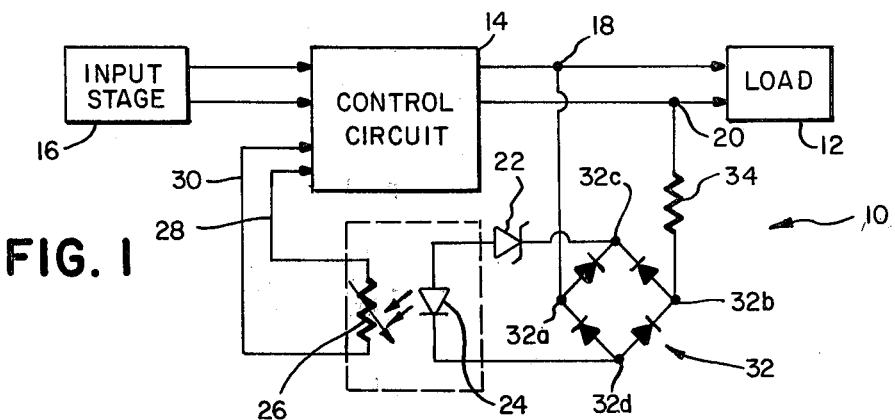
FIG. 1 is a schematic representation, partly in block form, of electrical apparatus employing a sensor embodying features of the invention.

The electrical device which FIG. 1 illustrates employs a sensor 10 according to the invention to produce a feedback signal from a load 12 which a control circuit 14 operates. The control circuit typically receives an input signal from an input stage 16. The illustrated load 12 has a pair of input terminals connected to output terminals of the control circuit, which as a pair of input terminals connected with the input stage and two further input terminals for receiving the feedback signal from the sensor 10. The illustrated control circuit applies a phase-controlled gated alternating voltage to the load, as produced for example with a triac, and the load terminals receive voltage pulses having opposite polarity in successive half cycles and with different durations and amplitudes according to the control circuit 14 operation. The load voltage is essentially zero, however, between these pulses.

Figure 2:
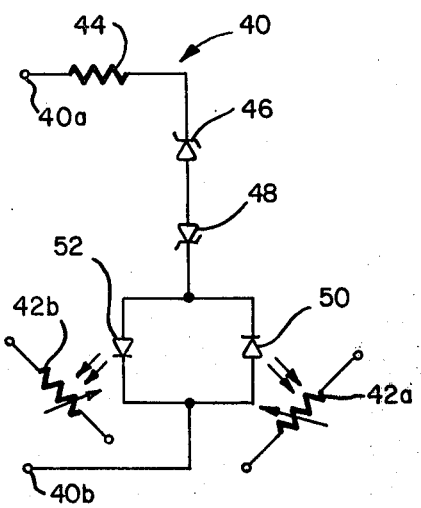
FIGS. 2, 3, 4, and 5 are schematic representations of different embodiments of the sensor which the invention provides.

The sensor 10 has input terminals 18, 20 to which this load voltage is applied. Within the sensor, a zener diode 22 is in series with a light-emitting diode 24, and a photoconductor 26 is optically coupled to, but electrically isolated from, the light-emitting diode 24. Sensor output conductors 28, 30 connect the photoconductor 26 to the control circuit 14. The illustrated sensor 10 also has a rectifier 32 in circuit with the sensor diodes 22 and 24 to convert the alternating voltage applied to the terminals 18, 20 to a unidirectional or direct voltage, which is applied across the series combination of the two diodes 22, 24. The polarity of the direct voltage reverse biases the zener diode 22 so that it operates on its zener characteristic. The direct voltage forward biases the light-emitting diode 24 and accordingly applies forward current through it. The illustrated rectifier 32 is a full-wave bridge rectifier having a first pair of bridge terminals 32a and 32b which receive the applied alternating voltage, and a second pair of bridge terminals 32c and 32d across which the series combination of the zener diode 22 and the light-emitting diode 24 are connected. FIG. 2 also shows that the illustrated sensor has a current-limiting resistor 34 in series between the rectifier 32 and one sensor input terminal 20 for limiting the current which the sensor draws from the control circuit-load interconnection.

The light-emitting diode 24 and photoconductor 26 preferably are packaged together in an opto-isolator, with the photoconductor receiving luminescence which the diode 24 emits in response to the forward current in it. By way of illustrative example, one sensor according to the invention employs LED-photoconductor isolators manufactured by the Clairex Electronics division of Clairex Corporation and marketed under the designations CLM6200 and CLM6500. By way of further example, the diode 22 for this embodiment can be a 1N4757 type zener diode.

The operation of the sensor stems from the finding that the forward current in the light-emitting diode 24 when in series with the zener conduction of the diode 22, varies with the mean square of the alternating voltage applied to the rectifier 32. The photoconductor 26 resistance varies inversely with illumination and hence with the current in the light-emitting diode 24. Hence the resistance varies with the mean square of the voltage applied to the sensor. As a result, depending on the connections within the control circuit 14 to the photoconductor 26, the sensor produces a current, voltage or other signal parameter responsive to the mean square of the sensor applied voltage. When one considers the resistance of the photoconductor, or the voltage across it, an increase in the voltage being applied to the sensor decreases these values, provided other parameters are held constant. On the other hand, for a given voltage across the photoconductor 26, the current in it increases with increasing sensor applied voltage.

FIGS. 2 through 5 show other arrangements of a mean square sensor according to the invention. Each sensor in these Figures has, just as the sensor 10 of FIG. 1, a pair of input terminals to which an input voltage is applied, at least one zener diode in series with a light-emitting diode, and a photoconductor optically coupled with the light-emitting diode. There usually also is a current-limiter, e.g., a resistor in series in the current path through the two diodes. More particularly, FIG. 2 shows a sensor 40 having input terminals 40a and 40b. In series between the input terminals are a current-limiting resistor 44, a first zener diode 46, a second zener diode 48, and the parallel combination of two light-emitting diodes 50 and 52. The two zener diodes are arranged for zener conduction in opposite directions, and the two light-emitting diodes are arranged for forward conduction in opposite directions. Each light-emitting diode 50, 52 is illustrated as optically coupled with a photoconductor 42a, 42b, respectively. It will be understood that this schematic representation of two photoconductors can be provided by two separate photoconductors or with a single photoconductor optically coupled with each diode 50, 52. Further, where there are two separate photoconductors, they can be arranged in series or in parallel with one another or in other configurations.

The FIG. 2 sensor 40 operates by having each zener diode and the one light-emitting diode that is poled for forward conduction in the same direction as the zener conduction, be operative only with input voltages that forward bias that light-emitting diode. Thus, zener diode 46 and light-emitting diode 52 are operative with an applied voltage that is positive at the input terminal 40a; the former element is reverse biased for zener conduction and the latter is forward biased. Forward conductions through zener diode 48 has negligable effect on the sensor performance, and reversed biased diode 50 is also of no effect. The photoconductor 42b receives luminescence resultant only from the diode 52 current. On the other hand, an applied voltage that drives the input terminal 40a negative relative to terminal 40b, causes conduction in the sensor through resistor 44, through diode 46 in the forward direction with negligable effect, through zener diode 48 on the zener characteristic, and in the forward direction through light-emitting diode 50 to activate photoconductor 42a.

Figure 3:
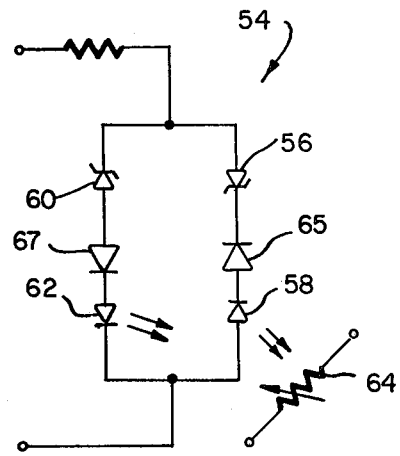

FIG. 3 shows an arrangement in which a sensor 54 has two series branches, each with a zener diode and a light-emitting diode, and the two branches are arranged in parallel. More specifically, the sensor 54 has one series branch with a zener diode 56 and a light-emitting diode 58. That series branch is in parallel with a second series branch in which a zener diode 60 is in series with a light-emitting diode 62. The forward conduction of the light-emitting diode in each series branch is in the same direction as the direction of zener conduction, as in the sensor 10 of FIG. 1. The sensor 54 further has a photoconductor 64 optically coupled with each light-emitting diode 58 and 62 in the same manner as described above with reference to FIG. 2. For most practical applications with presently available components, each branch also has a rectifier 65, 67 poled for forward conduction with the diode 58, 62, respectively, in the same branch. Where the light-emitting diodes can withstand the applied reverse voltage, they can function also as rectifiers, and the separate rectifiers 65 and 67 can be omitted.

The sensor 54 operates with either series path being conductive, depending on the polarity of the applied input voltage. Thus, for a sinusoidal alternating input voltage, each series branch will be conductive, and hence operative, in different half-cycles. A rectifying diode in each branch renders that branch inoperative during half-cycles when the input voltage polarity reverse biases that diode.

Figure 4:
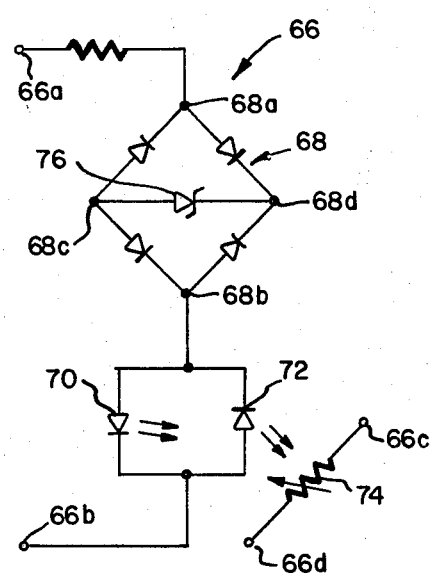

The sensor 66 in FIG. 4 employs a full-wave bridge rectifier 68 connected in series with parallel-connected light-emitting diodes 70 and 72 between sensor input terminals 66a and 66b. The diodes are poled for conduction in opposite directions. Both light-emitting diodes are optically coupled with, but electrically isolated from, photoconductive means illustrated as a common photoconductor 74. As with the sensors in FIGS. 2 and 3, this photoconductor 74 can employ two separate photoconductors, each optically coupled with a single one of the light-emitting diodes. In addition to the FIG. 4 connection of the bridge circuit 68 with the light-emitting diodes 70, 72 at first bridge terminals 68a and 68b, the sensor 66 has a zener diode 76 connected between the other bridge terminals 68c and 68d and poled to conduct the rectified current on its zener characteristic. Thus, when the applied voltage drives bridge terminal 68a positive, the upper right diode and the lower left diode of the bridge rectifier forward current from bridge terminal 68d through the zener conduct diode to bridge terminal 68c. Conversely, when the applied input reverses polarity, the lower right bridge diode (connected between terminals 68b and 68d) and the upper left diode (connected between terminals 68c and 68a) conduct forward current. The zener conduction in diode 76 is again from terminal 68d to terminal 68c.

Figure 5:
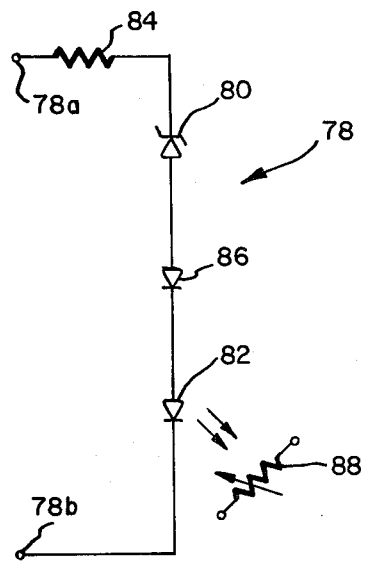

As a further variation of the practice of the invention, FIG. 5 shows a sensor 78 in which the series combination of a zener diode 80 and a light-emitting diode 82 is in series with a half-wave rectifier 86. A photoconductor 88 is optically coupled with the light-emitting diode 82. The illustrated sensor also has a current-limiting series resistor 84. The sensor 78 develops a resistance in the photoconductor 88 which varies inversely with the mean value only of input voltage having a polarity that drives input terminal 78a positive relative to terminal 78b. That is, the sensor 78 is responsive only to applied voltage of a single polarity i.e., the polarity which forward biases the rectifying diode 86; this diode is blocked and not conductive for voltages of the opposite polarity.

Figure 6:
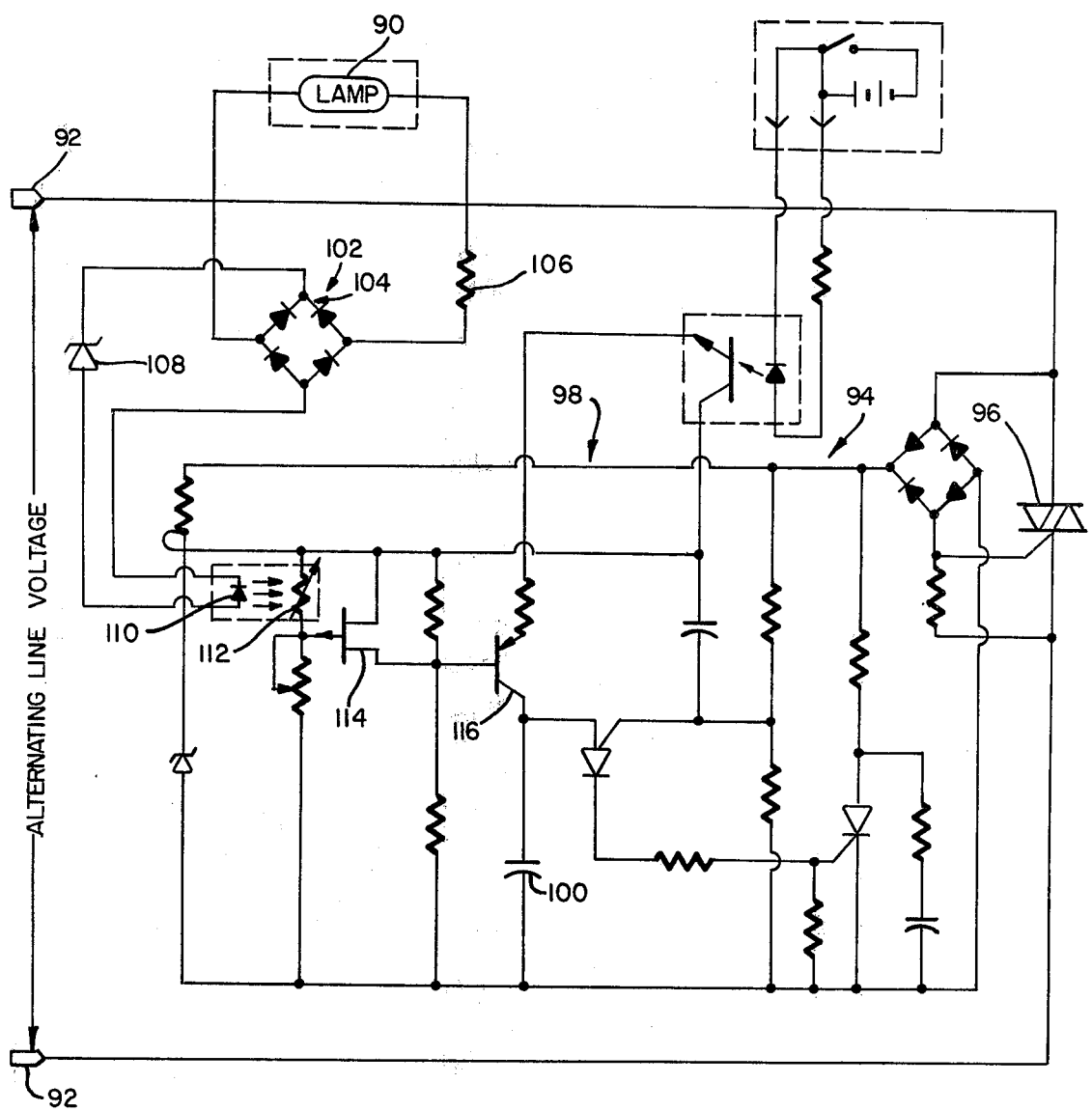
FIG. 6 is a schematic representation of a regulator circuit incorporating the sensor of FIG. 1.

FIG. 6 illustrates one application of the sensor of FIG. 1 in a regulator that operating a photographic lamp 90 from alternating line voltage applied to terminals 92. As described in detail in the commonly-assigned U.S. application Ser. No. 938,767 of Herbert L. Hardy for "Regulator Circuit for Photographic Illumination" filed on even date herewith, the regulator has a control stage 94 that triggers a triac 96 to apply line voltage to the lamp 90 selectively in each half-cycle of alternation. A feed-forward stage 98 selectively applies the charge on a timing capacitor 100 to the control stage, and a feedback stage 102 selectively controls the rate at which the capacitor is charged.

The latter stage incorporates the sensor of this invention to control the capacitor-charging in response to the mean square of the alternating voltage which the regulator develops across the lamp 90. This enables the regulator to maintain the RMS value of the lamp voltage at a selected value with a line voltage of widely varying amplitude and frequency. More particularly, the sensor employs a bridge rectifier 104 in series with a resistor 106 across the lamp 90. The series combination of a zener diode 108 and a light-emitting diode 110 receives the rectifier direct voltage, and the electroluminescense from the diode 110 activates a photoconductor 112 optically coupled thereto. The change in photoconductor resistance which the sensor produces, as discussed with reference to the prior Figures, controls the impedance of a transistor 114. This in turn controls the conduction in a transistor 116 that charges the timing capacitor.

The FIG. 6 regulator is exemplary of the numerous applications which those skilled in the art will find for the sensor of this invention.

The invention thus provides sensors for producing an electrical resistance with a value varying inversely to the mean square of an applied voltage. Each sensor employs, in one form or another, the zener conduction of a first diode in series with the forward conduction of a light-emitting diode, and further employs the transfer function, with relatively fast rise time and slow decay time, between the light-emitting diode and a photoconductor optically coupled with it. The applied voltage exceeds the zener breakdown value of the first diode; and the photoconductor can be electrically isolated from the diode-containing series path of the sensor. The sensor can have any of several configurations, as illustrated, with other circuit elements and particularly with additional light-emitting diodes and zener diodes, or with other rectifying elements, for responding to applied voltages having only one selected polarity or for responding to both polarities of the applied voltage.

It will thus be seen that the objects set forth above, among those made apparent from the preceding description, are efficiently attained. Sine certain changes may be made in the above constructions without departing from the scope of the invention, it is intended that all matter contained in the above description and shown in the accompanying drawings be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. An electrical sensor circuit for producing an electrical output signal parameter corresponding to the mean square of an applied alternating voltage, said sensor comprising:
   input terminals for receiving the applied AC voltage;
   zener diode means, for receiving the applied alternating voltage and for providing a reverse zener voltage breakdown characteristic less than the maximum amplitude of the applied AC voltage;
   light-emitting diode means in series electrical connection with respect to said zener diode means for providing a forward biased conduction path upon the breakdown of said reverse zener diode voltage by the applied alternating voltage; and
   inactive photoresponsive resister means optically coupled with respect to said light-emitting diode means for receiving electroluminescence emitted therefrom in response to said current flow through said light-emitting diode means, the resistance of said photoconductor means thereby varying as a function of the mean square of the applied alternating voltage.

2. The electrical sensor circuit of claim 1 wherein said light-emitting diode means and said photoconductor means comprise an opto-isolator.

3. The electrical sensor circuit of claim 1 further comprising current-limiting means in series electrical connection with respect to the current path through said zener diode means and said light-emitting diode means.

4. The electrical sensor circuit of claim 1 further comprising rectifier means connected with said input terminals for receiving the applied alternating voltage and connected with respect to said zener diode means and said light-emitting diode means for applying a rectified voltage thereto responsive to the applied alternating voltage.

5. The electrical sensor circuit of claim 4 in which said rectifier means includes a rectifier electrically connected in series with said zener diode means and said light-emitting diode means between said input terminals.

6. The electrical sensor circuit of claim 5 in which said rectifier is a half-wave rectifier having forward conduction in the same direction as said light-emitting diode means.

7. The electrical sensor circuit of claim 5 in which said rectifier means is a full-wave bridge rectifier having a first pair of terminals connected to said input terminals and having a second pair of terminals across which said zener diode means and said light-emitting diode means are electrically connected in series.

8. The electrical sensor circuit of claim 1 wherein said zener diode means comprises first and second zener diodes connected for zener conduction in opposite directions with respect to each other.

9. An electrical sensor circuit for producing an electrical output signal parameter corresponding to the mean square of an applied alternating voltage, said sensor comprising:
   input terminals for receiving the applied AC voltage;
   zener diode means, for receiving the applied alternating voltage and for providing a reverse zener voltage breakdown characteristic less than the maximum amplitude of the applied AC voltage;
   light-emitting diode means in series electrical connection with respect to said zener diode means for providing a forward biased conduction path upon the breakdown of said reverse zener diode voltage by the applied alternating voltage; and
   photoconductor means optically coupled with respect to said light-emitting diode means for receiving electroluminescence emitted therefrom in response to said current flow through said light-emitting diode means, the resistance of said photoconductor means thereby varying as a function of the mean square of the applied alternating voltage, wherein said zener diode means comprises first and second zener diodes connected for zener conduction in opposite directions with respect to each other, and wherein said second zener diode is electrically connected in series relation with respect to said first zener diode, and said light-emitting diode means comprises first and second light-emitting diodes optically coupled with respect to said photoconductor means, said light-emitting diodes also being connected in parallel with respect to each other and arranged for forward biased conduction in mutually opposing directions.

10. An electrical sensor circuit for producing an electrical output signal parameter corresponding to the mean square of an applied alternating voltage, said sensor comprising:
    input terminals for receiving the applied AC voltage;
    zener diode means, for receiving the applied alternating voltage and for providing a reverse zener voltage breakdown characteristic less than the maximum amplitude of the applied AC voltage;
    light-emitting diode means in series electrical connection with respect to said zener diode means for providing a forward biased conduction path upon the breakdown of said reverse zener diode voltage by the applied alternating voltage; and
    photoconductor means optically coupled with respect to said light-emitting diode means for receiving electroluminescence emitted therefrom in response to said current flow through said light-emitting diode means, the resistance of said photoconductor means thereby varying as a function of the mean sqaure of the applied alternating voltage, wherein said light-emitting diode means comprises first and second light-emitting diodes optically coupled with said photoconductor means, and said zener diode means comprises first and second zener diodes electrically connected in series respectively with said first and second light-emitting diodes with the combination of each of said series-connected zener diodes and light-emitting diodes being electrically connected in parallel relation with respect to each other, so that the direction of forward bias conduction for said second zener diode and said second light-emitting diode is opposite to that of said first zener diode and said first light-emitting diode.

11. The electrical sensor circuit of claim 4 wherein said rectifier means includes a full-wave bridge rectifier having a first pair of bridge terminals and a second pair of bridge terminals, said bridge rectifier being connected electrically in series at said first pair of bridge terminals with said light-emitting diode means, between said input terminals, and wherein said zener diode means is connected between said second pair of bridge terminals to provide said reverse zener voltage breakdown characteristic to the rectified voltage from said rectifier means.

12. An electrical sensor circuit for producing an electrical output signal parameter corresponding to the mean square of an applied alternating voltage, said sensor comprising:
    input terminals for receiving the applied AC voltage;
    zener diode means, for receiving the applied alternating voltage and for providing a reverse zener voltage breakdown characteristic less than the maximum amplitude of the applied AC voltage;
    light-emitting diode means in series electrical connection with respect to said zener diode means for providing a forward biased conduction path upon the breakdown of said reverse zener diode voltage by the applied alternating voltage;
    photoconductor means optically coupled with respect to said light-emitting diode means for receiving electroluminescence emitted therefrom in response to said current flow through said light-emitting diode means, the resistance of said photoconductor means thereby varying as a function of the mean square of the applied alternating voltage; and
    rectifier means connected with said input terminals for receiving the applied alternating voltage and connected with respect to said zener diode means and said light-emitting diode means for applying a rectified voltage thereto responsive to the applied alternating voltage, wherein said rectifier means includes a full-wave bridge rectifier having a first pair of bridge terminals and a second pair of bridge terminals, said bridge rectifier being connected electrically in series at said first pair of bridge terminals with said light-emitting diode means, between said input terminals, and wherein said zener diode means is connected between said second pair of bridge terminals to provide said reverse zener voltage breakdown characteristic to the rectified voltage from said rectifier means, and wherein said light-emitting diode means comprises first and second light-emitting diodes optically coupled with said photoconductor means, said first and second light-emitting diodes also being connected electrically in parallel with respect to each other and arranged for forward biased conduction in mutually opposite directions with respect to each other, the parallel combination of said first and second light-emitting diodes being electrically connected in series, with said first pair of bridge terminals between said input terminals.

* * * * *